(12) United States Patent
Matsui et al.

(10) Patent No.: US 7,874,847 B2
(45) Date of Patent: Jan. 25, 2011

(54) ELECTRONIC PART AND CIRCUIT SUBSTRATE

(75) Inventors: Jun Matsui, Kawasaki (JP); Koji Terada, Kawasaki (JP); Hiroyuki Nobuhara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 504 days.

(21) Appl. No.: 11/898,713

(22) Filed: Sep. 14, 2007

(65) Prior Publication Data

US 2008/0018423 A1 Jan. 24, 2008

Related U.S. Application Data

(63) Continuation of application No. PCT/JP2005/005030, filed on Mar. 18, 2005.

(51) Int. Cl.
*H01R 12/00* (2006.01)
(52) U.S. Cl. .............. 439/66; 439/78; 439/60
(58) Field of Classification Search ........... 439/60, 439/66, 78, 82, 924.1
See application file for complete search history.

(56) References Cited

U.S. PATENT DOCUMENTS

| | | | |
|---|---|---|---|
| 4,124,877 A * | 11/1978 | Vollenweider | 361/729 |
| 6,517,362 B2 | 2/2003 | Hirai et al. | |
| 6,887,085 B2 * | 5/2005 | Hirai | 439/82 |
| 7,080,993 B2 * | 7/2006 | Yoshida et al. | 439/82 |
| 7,137,831 B2 * | 11/2006 | Okamoto et al. | 439/82 |
| 7,380,337 B2 * | 6/2008 | Soeta | 29/832 |
| 7,530,814 B2 * | 5/2009 | Ramaswamy et al. | 439/66 |
| 7,564,130 B1 * | 7/2009 | Li | 257/734 |
| 7,628,616 B2 * | 12/2009 | Yoshida et al. | 439/66 |
| 2002/0013010 A1 | 1/2002 | Maruyama et al. | |
| 2002/0037657 A1 | 3/2002 | Hirai et al. | |
| 2003/0060064 A1 * | 3/2003 | Hirai et al. | 439/82 |
| 2004/0185694 A1 * | 9/2004 | Hirai | 439/82 |
| 2008/0018423 A1 * | 1/2008 | Matsui et al. | 335/126 |

FOREIGN PATENT DOCUMENTS

| | | |
|---|---|---|
| JP | 10-041025 A | 2/1998 |
| JP | 11-040713 | 2/1999 |
| JP | 2000-340709 | 12/2000 |
| JP | 2001-068594 | 3/2001 |
| JP | 2002-5992 A | 1/2002 |
| JP | 2002-175859 A | 6/2002 |
| JP | 3440243 | 6/2003 |
| JP | 2004-234872 | 8/2004 |
| JP | 2004-327182 | 11/2004 |

OTHER PUBLICATIONS

International Search Report PCT/JP2005/005030 dated Jun. 14, 2005.

* cited by examiner

*Primary Examiner*—James Harvey
(74) *Attorney, Agent, or Firm*—Staas & Halsey LLP

(57) ABSTRACT

Electrical connection is established by bringing solder bumps formed as electrical connecting terminals of an electronic part and spiral contactors formed as electrical contactors of a circuit substrate into contact with each other. The solder bumps are formed such that heights thereof relative to a surface on which the solder bumps are formed are different from each other.

2 Claims, 12 Drawing Sheets form the electrical connecting terminal 602, and the electrical connecting terminal 603 are sequentially connected to the electrical contactors 702. When the electronic part 600 is removed from the circuit substrate 700, the terminals are disconnected in the opposite order. Such a structure is referred to as a pin grid array (PGA).

In other words, in the hot swap mechanism of conventional connecting structures such as the card-edge connection shown in FIG. 11 and PGA shown in FIG. 12, by forming parts corresponding to one of the connecting parts (wiring or connecting terminal), which are connected to each other, in different lengths (wiring length, etc) in the direction of electrical connection, the hot swap mechanism is implemented in which contact timing of the respective parts is varied. With this arrangement, replacement or the like of electronic parts in a state in which, for example, wirings of a power source and a ground are kept alive while a wiring of a circuit is not (for example, Japanese Patent Laid-Open Publication No. H10-41025).

There still are some problems with the hot swap mechanism described above. For example, in the card-edge connection, the wirings 402 to 404 can only be formed on the main surface 401, which is on only one of the two sides of the plug-type connection terminal 400. In PGA, to maintain strength, the electrical connecting terminals 601 to 603 cannot be formed at intervals smaller than certain intervals in the electronic part 600, in other words, there is a limit in terms of high density mounting.

Therefore, to achieve further high density mounting, mounting techniques such as a ball grid array (BGA) and a land grid array (LGA) have been developed, which enable electrical connection between an electronic part and a circuit substrate with electrodes formed at 0.5 millimeter (mm) intervals. However, in BGA and LGA, once electrical connection with the circuit substrate is established, connectors such as an electrode bump and an electrode land are mechanically connected to each other permanently. Therefore, this mounting technique is not suitable for part replacement or the like (For example, Japanese Patent Laid-Open Publication Nos. 2000-340709 and 2001-68594).

Therefore, electrical connection of an electronic part and a circuit substrate in which part replacement or the like can be easily done has been achieved by arranging deformable spiral contactors on the circuit substrate while maintaining correspondence with the electrode shape in BGA and the like. FIGS. 13A to 13C and FIGS. 14A to 14C are action transition diagrams for explaining electrical connection between an electronic part and a circuit substrate using conventional spiral contactors. First, as shown in FIG. 13A, in an electronic part 800, a plurality of spherical electrical connecting terminals (electrode bumps) 801 to 803 are formed. Moreover, in a circuit substrate 850, a plurality of planar spiral contactors 851 to 853 are formed at positions corresponding to connecting positions with the electrical connecting terminals 801 to 803.

As shown in FIG. 13B, if the electronic part 800 is gradually brought close to the circuit substrate 850 in the direction of the electrical connection (direction indicated by the outlined arrow in FIG. 13B), each of the electrical connecting terminals 801 to 803 comes into contact with each of the spiral contactors 851 to 853 at substantially the same time. Then, as shown in FIG. 13C, each of the spiral contactors 851 to 853 deforms in the direction of electrical connection (direction indicated by an outlined arrow in FIG. 13C), thereby securely connecting each of the electrical connecting terminals 801 to 803 and each of the spiral contactors 851 to 853.

Furthermore, as shown in FIG. 14A, in an electronic part 900, a plurality of planar electrical contactors 901 to 903 are formed. In a circuit substrate 950, a plurality of convex spiral contactors 951 to 953 are formed at positions corresponding to connecting positions with the electrical contactors 901 to 903. As shown in FIG. 14B, if the electronic part 900 is gradually brought close to the circuit substrate 950 in the direction of the electrical connection (direction indicated by the outlined arrow in FIG. 14B), each of the electrical contactors 901 to 903 comes into contact with each of the spiral contactors 951 to 953 at substantially the same time. Then, as shown in FIG. 14C, each of the spiral contactors 901 to 903 deforms into a planar shape, thereby connecting each of the electrical contactors 901 to 903 and each of the spiral contactors 951 to 953 securely (for example, Japanese Patent No. 3440243).

In the electrical connection of the electronic part and the circuit substrate shown in FIGS. 13A to 13C and FIGS. 14A to 14C, the electrical connecting terminals 801 to 803 (901 to 903) and the spiral contactors 851 to 853 (951 to 953) come into contact at substantially the same time. Therefore, although an attaching/detaching mechanism of the electronic part 800 (900) and the circuit substrate 850 (950) is implemented, a hot swap mechanism in which, for example, after a power circuit in the electronic part 800 (900) is energized, energizing of a predetermined circuit is difficult to implement together with the attaching/detaching mechanism.

In addition, for high integration and high density, it is difficult to implement both the attaching/detaching mechanism of the electronic parts and the hot swap mechanism at the same time in a chip size package (CSP) technique, such as BGA and LGA. The techniques disclosed in the patent documents mentioned above do not provide a technique that achieves the attaching/detaching mechanism of the electronic parts and the hot swap mechanism at the same time, either.

SUMMARY OF THE INVENTION

It is an object of the present invention to at least solve the above problems in the conventional technologies.

An electronic part according to one aspect of the present invention is mounted on a circuit substrate having a plurality of elastic electrical contactors, and includes a plurality of electrical connecting terminals enabling to establish electrical connection with the circuit substrate by contacting the electrical contactors. The electrical connecting terminals are formed to be different in height from each other relative to a surface on which the electrical connecting terminals are formed.

A circuit substrate according to another aspect of the present invention includes a plurality of electrical contactors that enable to establish electrical connection with an electronic part that is mounted on the circuit substrate and that includes a plurality of electrical connecting terminals, by contacting the electrical connecting terminals. The electrical contactors are elastic, and are different from each other in height relative to a surface on which the electrical contactors are formed, in a state in which no external force is applied.

The other objects, features, and advantages of the present invention are specifically set forth in or will become apparent from the following detailed description of the invention when read in conjunction with the accompanying drawings.

DETAILED DESCRIPTION OF THE PREFERRED EMBODIMENTS

Exemplary embodiments according to the present invention are explained in detail with reference to the accompanying drawings.

In electrical connection of an electronic part and a circuit substrate according to a first embodiment of the present invention, spherical connecting terminals (solder bumps) having different sizes (diameters) are used as the electrical connecting terminals of the electronic part, and planar spiral contactors having different sizes (diameters) are used as the electrical contactors of the circuit substrate.

Figure 1:
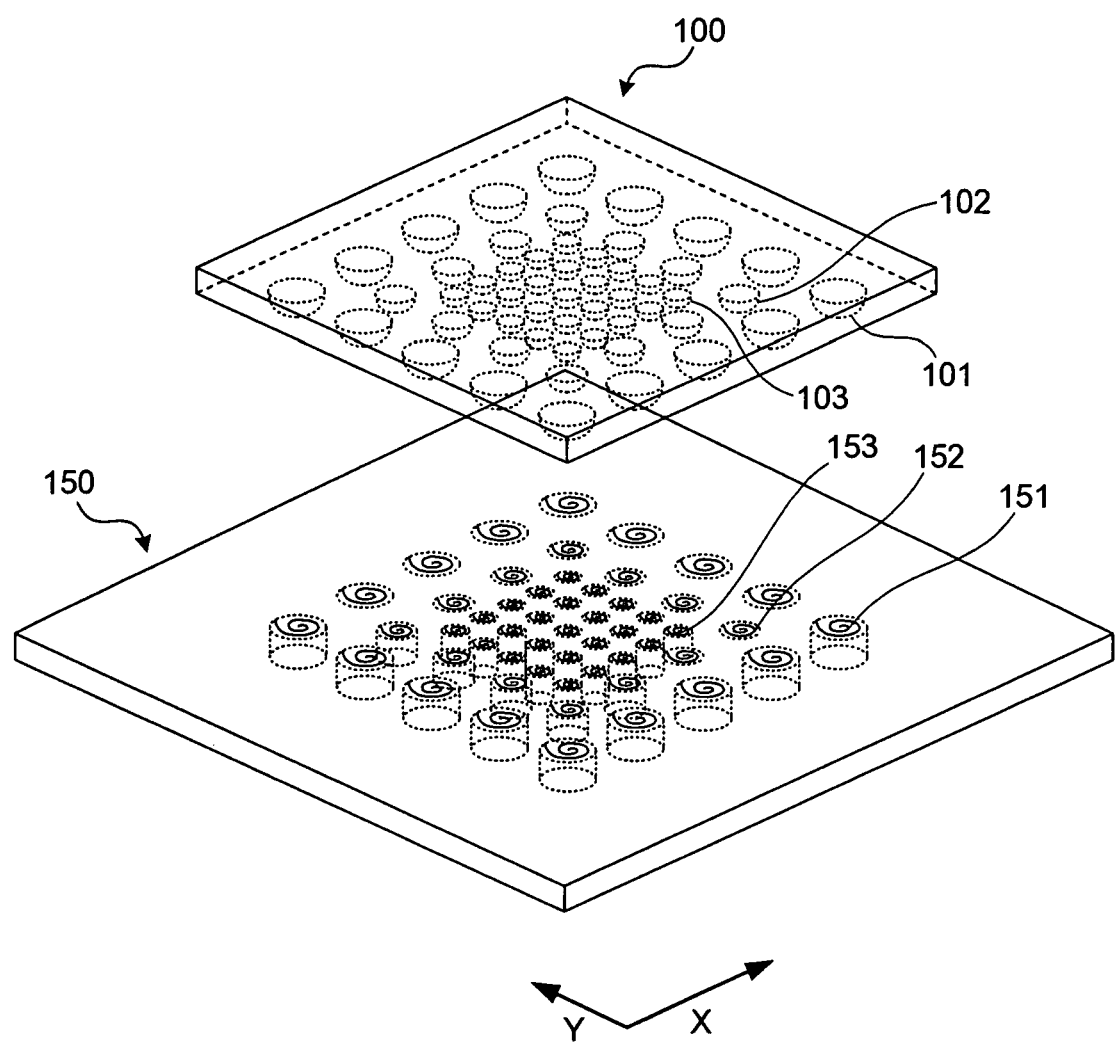
FIG. 1 is a perspective view of an electronic part and a circuit substrate according to a first embodiment of the present invention.
Figure 2:
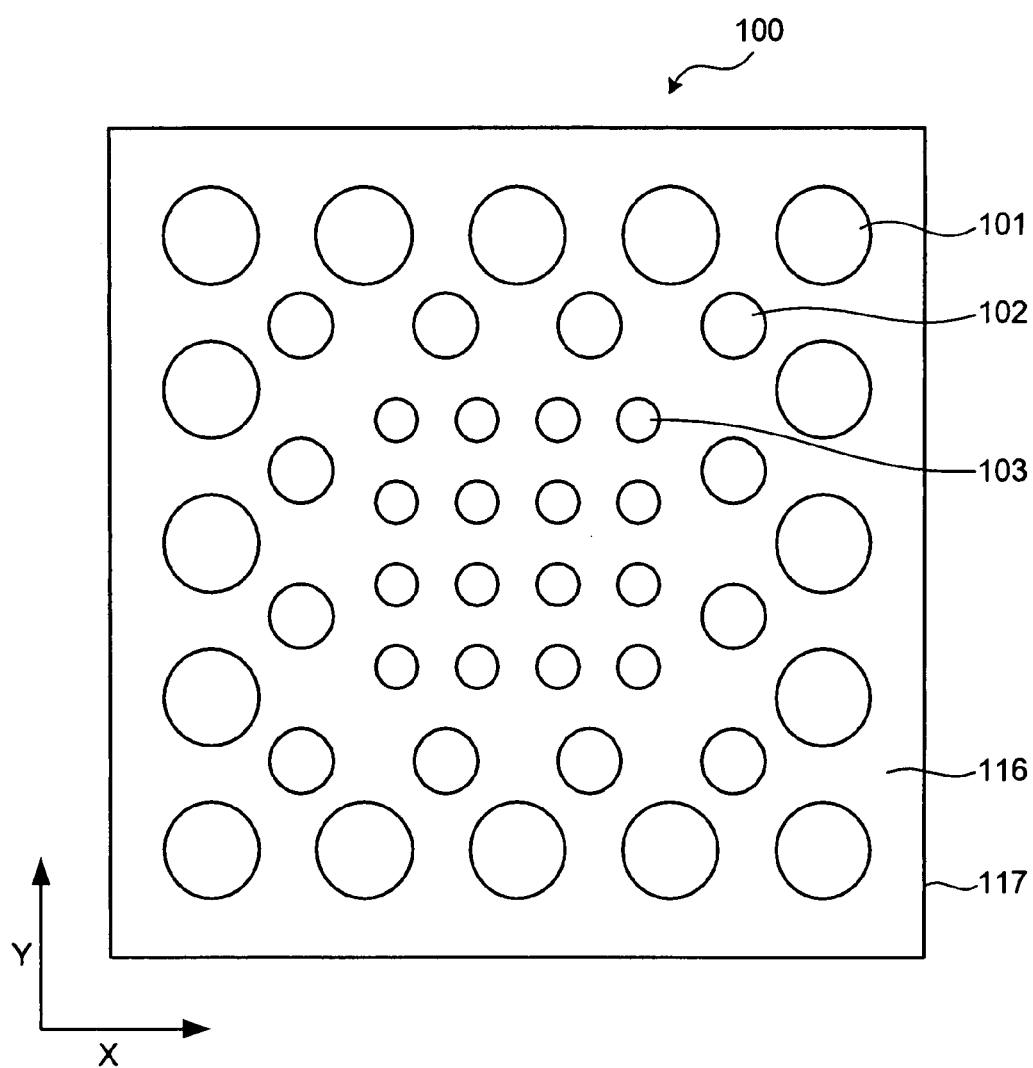
FIG. 2 is a plan view of the electronic part according to the first embodiment viewed from a circuit-substrate side.

FIG. 1 is a perspective view of the electronic part and the circuit substrate according to the first embodiment. FIG. 2 is a plan view of the electronic part according to the first embodiment viewed from a circuit-substrate side. As shown in FIGS. 1 and 2, in an electronic part 100, such as CSP, spherical solder bumps 101 to 103 as a plurality of electrical connecting terminals are formed on a main surface 116 of a connecting substrate 117 (see FIG. 2), and arranged two-dimensionally in an X direction and a Y direction. Moreover, in a circuit substrate 150 on which the electrical part 100 is mounted, planar spiral contactors 151 to 153 as a plurality of electrical contactors are formed at positions respectively corresponding to positions of the solder bumps 101 to 103, and arranged two-dimensionally in the X direction and the Y direction.

The solder bumps 101 to 103 are formed in such relation as the solder bump 101>the solder bump 102>the solder bump 103 in diameter, and are arranged in order of the solder bump 103, the solder bump 102, and the solder bump 101 toward the end of the main surface 116 of the connecting substrate 117 so that the diameter of the solder bumps gradually increases. The spiral contactors 151 to 153 are formed in such relation as the spiral contactor 151>the spiral contactor 152>the spiral contactor 153 in diameter so as to correspond to the solder bumps 101 to 103, respectively.

Figure 3A:
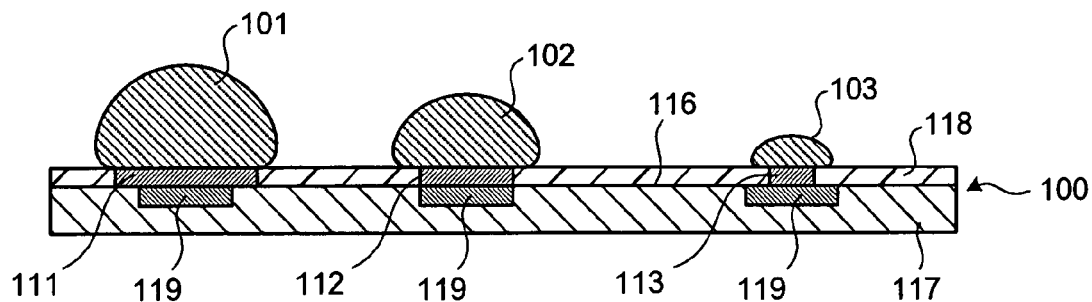
FIGS. 3A to 3C are diagrams showing a process of forming solder bumps of the electronic part according to the first embodiment.
Figure 3B:
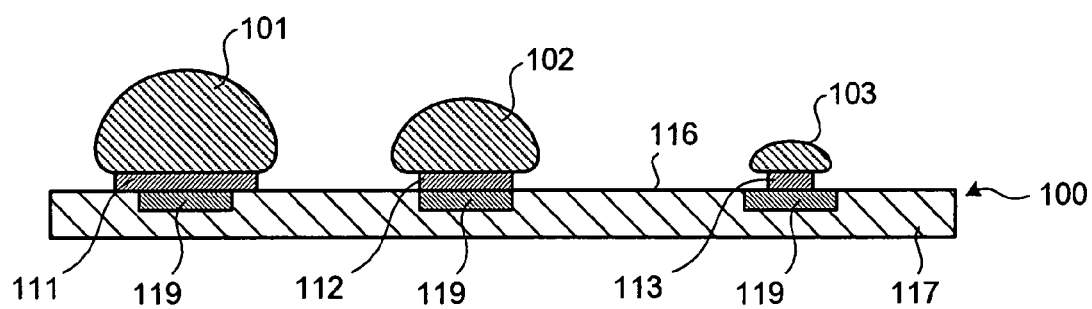
Figure 3C:
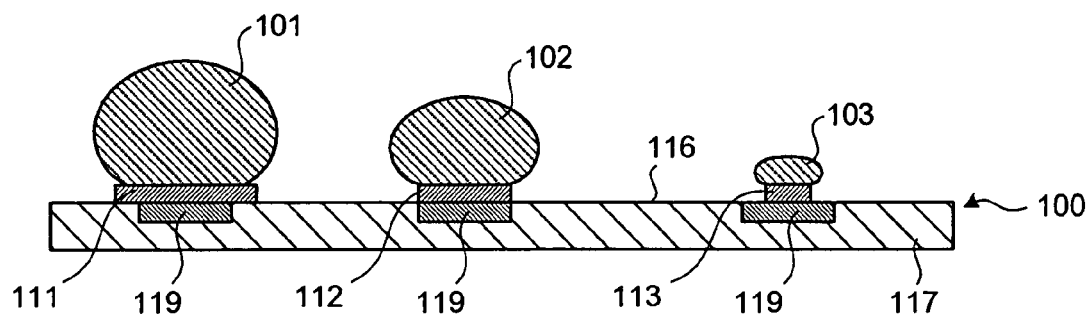

FIGS. 3A to 3C are diagrams showing a process of forming the solder bumps 101 to 103. First, as shown in FIG. 3A, a conductor (wiring) pattern 119 formed with a wiring metal material, such as Au, Ag, Cu, and an alloy thereof, is formed in the connecting substrate 117 that is formed with an insulating material, on a side facing the main surface 116.

Electrode lands 111 to 113 formed with Cu and the like in desirable sizes are formed on the conductor pattern 119, and the rest of the main surface 116 is covered with a resist 118. The solder bumps 101 to 103 are formed by plating on the electrode lands 111 to 113, for example, by putting the connecting substrate 117 in liquid obtained by heating solder to be melted in a deoxygenated atmosphere. At this time, if the electrode lands 111 to 113 are formed in such relation as the electrode land 111>the electrode land 112>the electrode land 113 in size (diameter), the amount of the solder to be plated differs depending on the size of the electrode lands 111 to 113 due to surface tension of the melted solder, thereby obtaining the solder bumps 101 to 103 of different sizes.

Subsequently, as shown in FIG. 3B, the resist 118 on the main surface 116 of the connecting substrate 117 is removed by peeling or the like. The connecting substrate 117 from which the resist 118 has been removed is heated again to cause the surface tension in the solder bumps 101 to 103, thereby arranging the solder bumps 101 to 103 in a spherical shape as shown in FIG. 3C. Thus, heights of the solder bumps 101 to 103 from the main surface 116 can be formed to differ. The spiral contactors 151 to 153 in the circuit substrate 150 are formed by a conventional technique such as photolithography using a light beam or the like, and therefore, explanation is omitted.

Figure 4A:
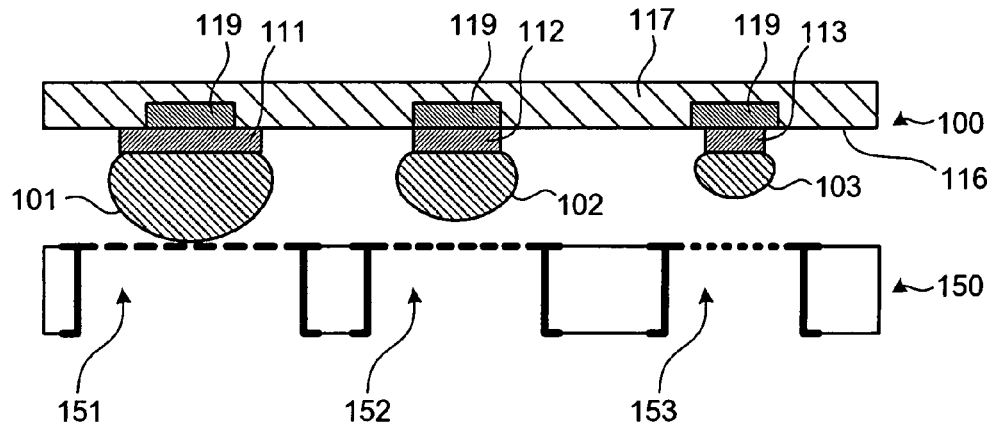
FIGS. 4A to 4C are diagrams showing a process of connecting the electronic part and the circuit substrate according to the first embodiment.
Figure 4B:
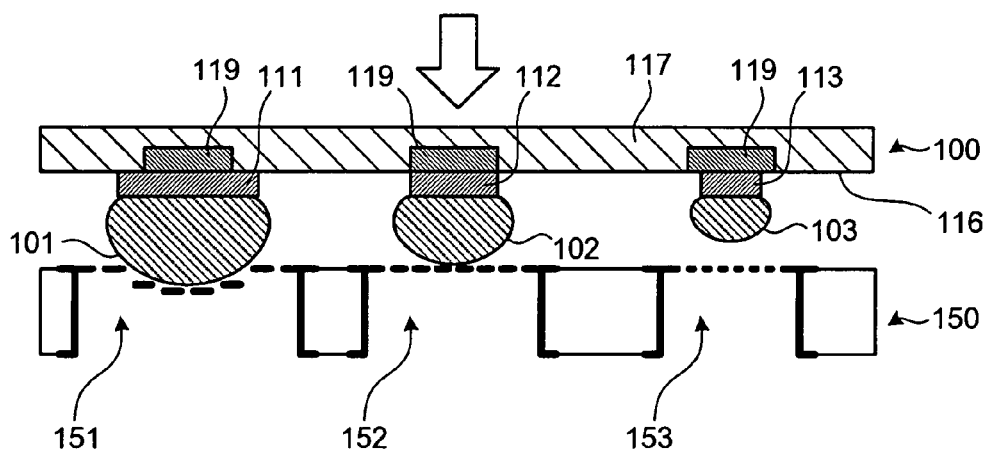
Figure 4C:
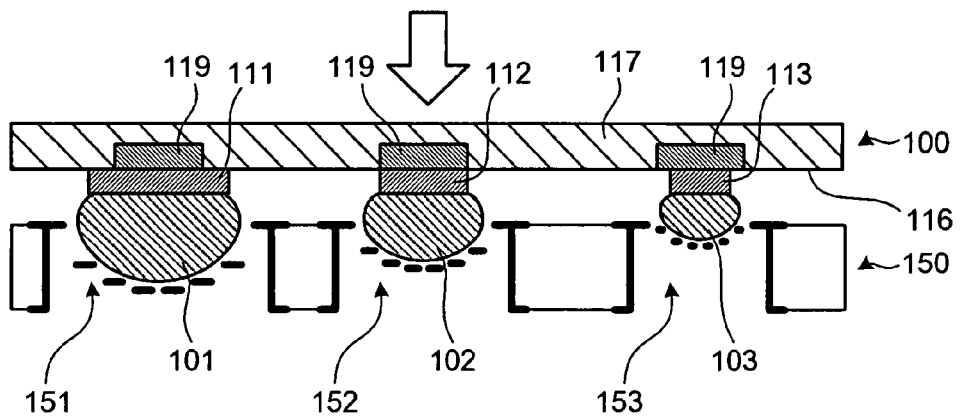

When the electronic part 100 in which the solder bumps 101 to 103 are thus formed is mounted on the circuit substrate 150, each of the solder bumps 101 to 103 and each of the spiral contactors 151 to 153 come into contact as follows to establish electrical connection. FIGS. 4A to 4C are diagrams showing a process of connecting the electronic part 100 and the circuit substrate 150. First, as shown in FIG. 4A, when the electronic part 100 is brought close to the circuit substrate 150, the solder bump 101 and the spiral contactor 151 having the largest diameter come into contact first.

Then, as shown in FIG. 4B, when the electronic part 100 is further brought close to the circuit substrate 150 in the direction of electrical connection (direction indicated by an outlined arrow in FIG. 4B), the solder bump 102 and the spiral contactor 152 having the second largest diameter come into contact. Finally, as shown in FIG. 4C, when the electronic part 100 is brought closer in the direction of electrical connection (direction indicated by the outlined arrow in FIG. 4C), the solder bump 103 and the spiral contactor 153 having the smallest diameter come into contact. Thus, the electronic part 100 and the circuit substrate 150 are electrically connected completely.

With such electrical connection, when the electronic part 100 is connected to the circuit substrate 150, it is possible to bring the solder bump 101 and the spiral contactor 151 into contact to be alive first, to bring the solder bump 102 and the spiral contactor 152 into contact to be alive next, and to bring the solder bump 103 and the spiral contactor 153 to be alive finally. Moreover, since each of the solder bumps 101 to 103 and each of the spiral contactors 151 to 153 are not mechanically connected, when the electronic part 100 is separated from the circuit substrate 150, it is possible to disconnect the solder bump 103 and the spiral contactor 153 first, the solder bump 102 and the spiral contactor 152 next, and the solder bump 101 and the spiral contactor 151 finally, in reverse order.

With this arrangement, a hot swap mechanism can be implemented, for example, by a configuration in which a power source circuit is energized by contact of the solder bump 101 and the spiral contactor 151, and other circuits such as a program circuit are energized by contact of the solder bumps 102 and 103 and the spiral contactors 152 and 153. Therefore, in addition to the hot swap mechanism, in which an arbitrary circuit in the electronic part 100 is energized first, and other circuits are energized later, the attaching/detaching mechanism of the electronic part 100 with respect to the circuit substrate 150 can also be implemented. In the first embodiment, the solder bumps 101 to 103 are arranged so that the height in the direction of contact gradually increases toward the edge of the main surface 116. This arrangement is suitable for the following cases.

Figure 5:
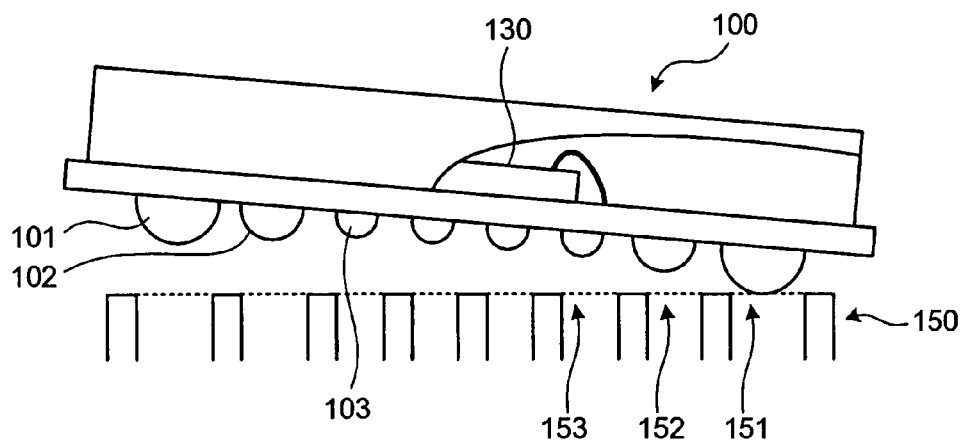
FIG. 5 is a side view of the electronic part, partially cut-away, and the circuit substrate according to the first embodiment.

FIG. 5 is a side view of the electronic part 100, partially cutaway, and the circuit substrate 150. As shown in FIG. 5, the solder bumps 101 to 103 of the electronic part 100 having, for example, a semiconductor chip 130 are formed such that the height thereof in the direction of contact gradually increases toward the edge. On the other hand, the spiral contactors 151 to 153 of the circuit substrate 150 are formed in a planar shape. With such a structure, even if the electronic part 100 is mounted on the circuit substrate 150 in a tilted state as shown in FIG. 5, it is possible to implement contact in the order of the solder bump 101, the solder bump 102, and the solder bump 103 to the spiral contactors 151 to 153. Therefore, by forming the solder bumps 101 to 103 such that the height thereof gradually increases toward the edge, the electrical connection of the electronic part and the circuit substrate according to the present invention can be surely implemented together with the hot swap mechanism.

Arrangement of the solder bumps 101 to 103 is not limited to the arrangement described above, and can be modified according to a desired connecting mode and the like. As described above, according to the electronic part and the circuit substrate according to the first embodiment, the size (height) of the solder bumps 101 to 103 of the electronic part 100 are varied in the direction of contact with the circuit substrate 150 relative to the main surface 116 of the connecting substrate 117. Therefore, the contact/separation timing of the respective solder bumps 101 to 103 and the respective spiral contactors 151 to 153 are varied, thereby implementing the hot swap mechanism of the electronic part 100 with respect to the circuit substrate 150. Moreover, since the electrical connection is achieved by bringing each of the solder bumps 101 to 103 and each of the spiral contactors 151 to 153 into contact, the attaching/detaching mechanism of the electronic part 100 with respect to the circuit substrate 150 can be achieved. Therefore, for example, at the time of maintenance or replacement of parts, attachment and detachment of the electronic part 100 is possible while achieving the hot swap mechanism. Furthermore, since this electrical connection of the electronic part and the circuit substrate is applicable to BGA and LGA, high density mounting of the electronic part 100 becomes possible.

In the first embodiment, a case where spherical contacting terminal (solder bumps) as the electrical connecting terminal of an electronic part and planar spiral contactors as the electrical contactors of a circuit substrate are respectively used has been explained.

On the other hand, in electrical connection of an electronic part and a circuit substrate according to a second embodiment of the present invention, disk-shaped connecting terminals (electrode lands) are used as the electrical connecting terminals of the electronic part, and convex spiral contactors are used as the electrical contactors of the circuit substrate. In the second embodiment, the same reference characters are used for the parts that have been explained, and duplicate explanation is omitted.

Figure 6:
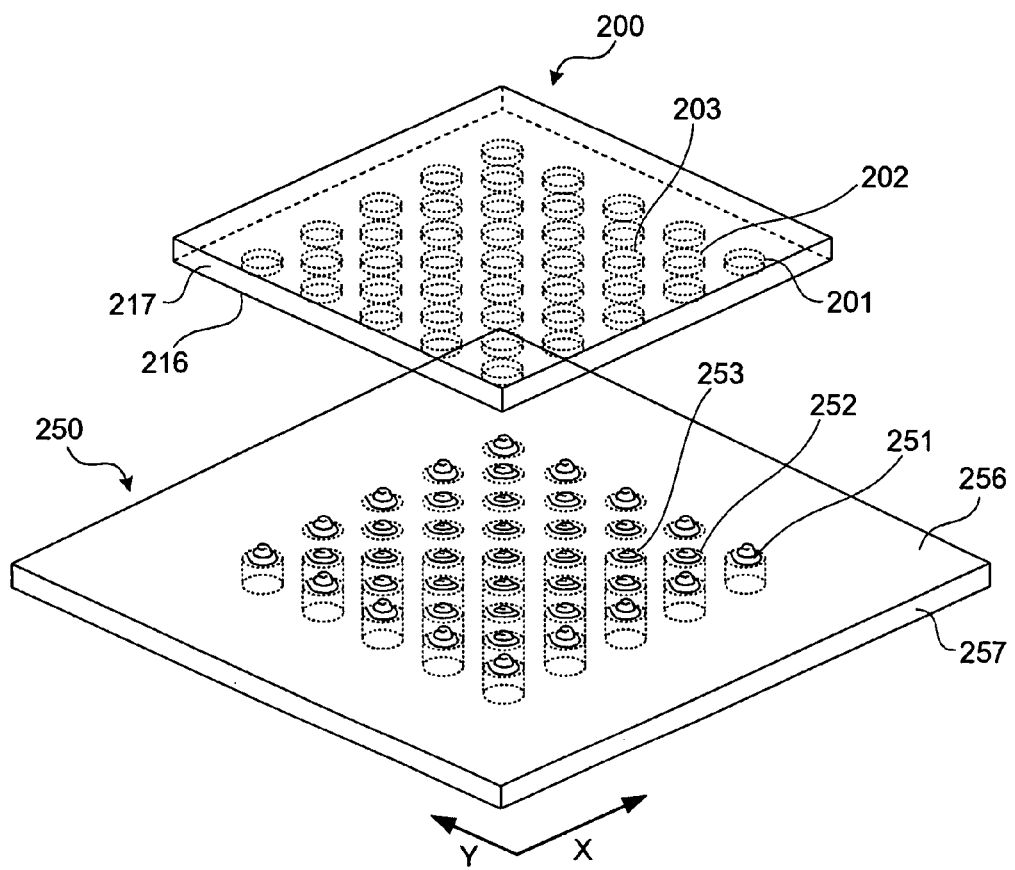
FIG. 6 is a perspective view of an electronic part and a circuit substrate according to a second embodiment of the present invention.

FIG. 6 is a perspective view of the electronic part and the circuit substrate according to the second embodiment. As shown in FIG. 6, in an electronic part 200, such as CPS, disk-shaped electrode lands 201 to 203 as a plurality of electrical connecting terminals are formed on a main surface 216 of a connecting substrate 217, and arranged two-dimensionally in the X direction and the Y direction. Moreover, in a circuit substrate 250 on which the electrical part 200 is mounted, convex spiral contactors 251 to 253 as a plurality of electrical contactors are formed at positions respectively corresponding to positions of the electrode lands 201 to 203, and arranged two-dimensionally in the X direction and the Y direction.

The electrode lands 201 to 203 are formed such that the size (diameter) thereof along the main surface 216 is identical. Similarly, the spiral contactors 251 to 253 are formed such that the size (diameter) thereof along a main surface 256 of an insulating substrate 257 is identical corresponding to the electrode lands 201 to 203, but the height thereof in the direction of contact with the electronic part 200 gradually increases toward the edge of the main surface 256.

Figure 7A:
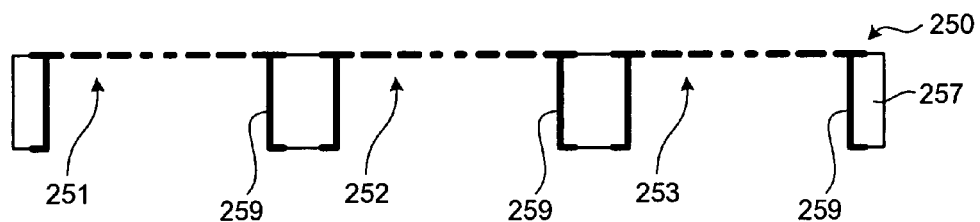
FIGS. 7A to 7C are diagrams showing a process of forming spiral contactors of the circuit substrate according to the second embodiment.
Figure 7B:
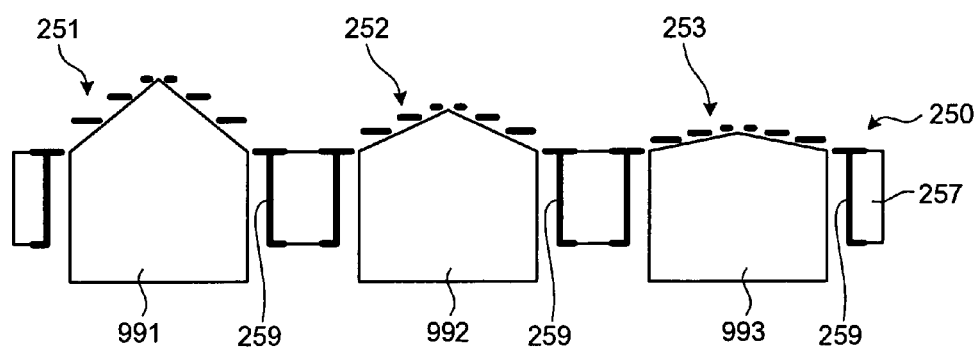
Figure 7C:
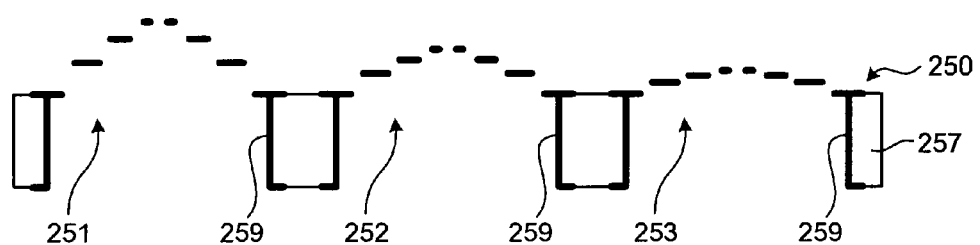

FIGS. 7A to 7C are diagrams showing a process of forming the spiral contactors 251 to 253. First, as shown in FIG. 7A, a plurality of holes 259 are opened in the insulating substrate 257 that is formed with an insulating material, and in openings of these holes 259, the spiral contactors 251 to 253 formed with a wiring metal material such as Cu are formed.

Subsequently, as shown in FIG. 7B, by inserting jigs 991 to 993 in a convex shape having a predetermined level in openings (not shown) of the holes 259 from the opposite side to the side on which the spiral contactors 251 to 253 are formed, the spiral contactors 251 and 253 are pressed into convex shapes. Finally, as shown in FIG. 7C, the jigs 991 to 993 are removed from the holes 259, thereby forming each of the spiral contactors 251 to 253 into convex shapes. The spiral contactors 251 to 253 are formed in such relation as the spiral contactor 251>the spiral contactor 252>the spiral contactor 253 in height of the convex portions thereof.

Figure 8A:
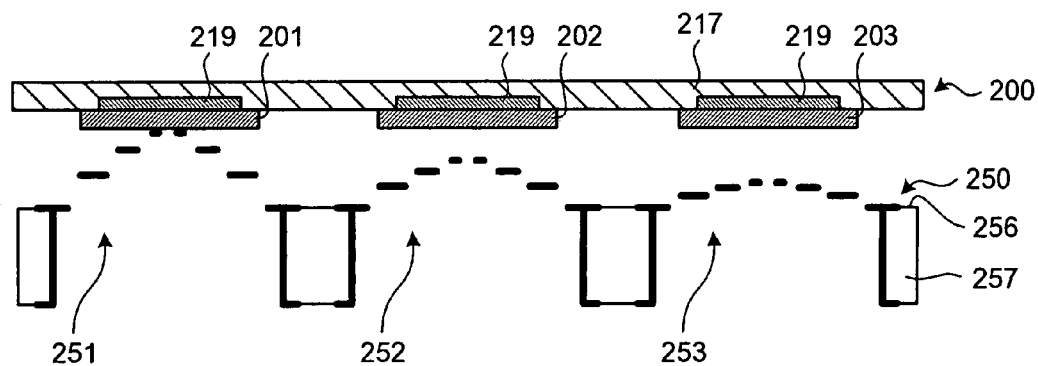
FIGS. 8A to 8C are diagrams showing a process of connecting the electronic part and the circuit substrate according to the second embodiment.
Figure 8B:
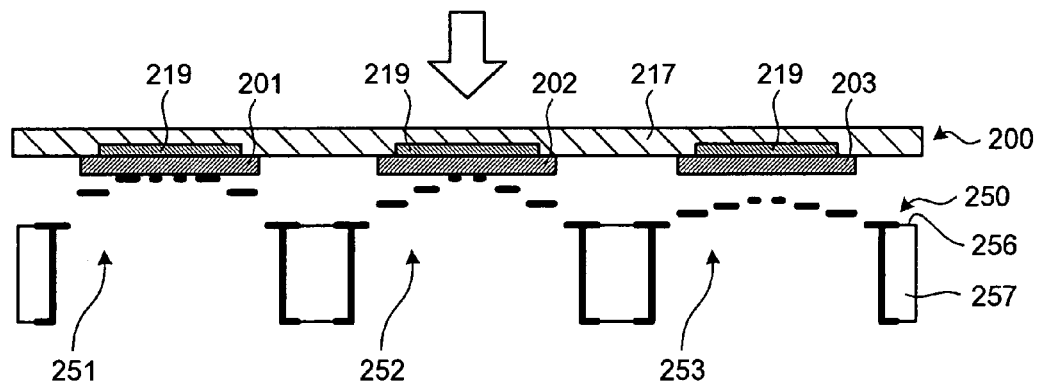
Figure 8C:
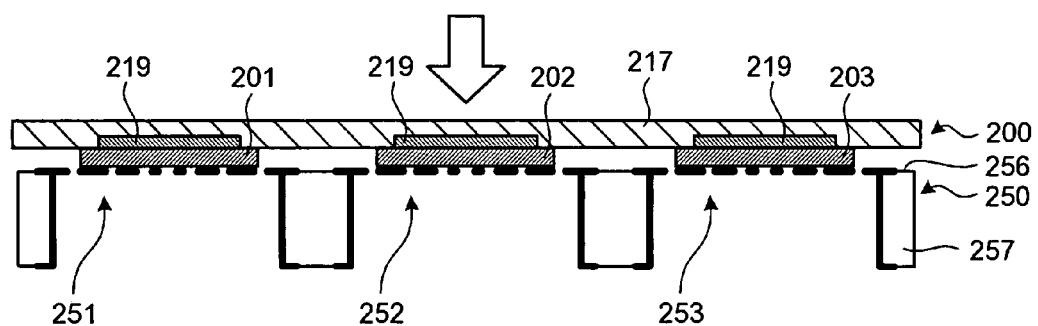

When the electronic part 200 is mounted on the circuit substrate 250 in which the spiral contactors 251 to 253 are thus formed, each of the electrode lands 201 to 203 and each of the spiral contactors 251 to 253 come into contact as follows to establish electrical connection. FIGS. 8A to 8C are diagrams showing a process of connecting the electronic part 200 and the circuit substrate 250. First, as shown in FIG. 8A, when the electronic part 200 in which the electrode lands 201 to 203 are formed on a conductor pattern 219 of the connecting substrate 217 is brought close to the circuit substrate 250, the spiral contactor 251 having the largest height and the electrode land 201 come into contact first.

Then, as shown in FIG. 8B, when the electronic part 200 is brought closer to the circuit substrate 250 in the direction of electrical connection (direction indicated by the outlined arrow in FIG. 8B), the spiral contactor 252 having the second largest height and the electrode land 202 come into contact. Finally, as shown in FIG. 8C, when the electronic part 200 is brought even closer in the direction of electrical connection (direction indicated by an outlined arrow in FIG. 8C), the spiral contactor 253 having the smallest height and the electrode land 203 come into contact. Thus, the electronic part 200 and the circuit substrate 250 are electrically connected completely.

With such electrical connection, when the electronic part 200 is connected to the circuit substrate 250, it is possible to bring the spiral contactor 251 and the electrode land 201 into contact to be alive first, to bring the spiral contactor 252 and the electrode land 202 into contact to be alive next, and to bring the spiral contactor 253 and the electrode land 203 into contact to be alive finally. Moreover, when the electronic part 200 is separated from the circuit substrate 250, it is possible to disconnect the electrode land 203 and the spiral contactor 253 first, the electrode land 202 and the spiral contactor 252 next, and the electrode land 201 and the spiral contactor 251 finally, in reverse order of the order in the case of connection.

With this arrangement, in addition to the hot swap mechanism, in which an arbitrary circuit in the electronic part 200 is energized first and other circuits are energized later, the attaching/detaching mechanism of the electronic part 200 with respect to the circuit substrate 250 can also be implemented. As described above, according to the electrical connection of the electronic part and the circuit substrate according to the second embodiment, the height of each of the spiral contactors 251 to 253 of the circuit substrate 250 is varied in the direction of contact with the electronic part 200 relative to the main surface 256 of the insulating substrate 257. Therefore, the contact/separation timing of the respective electrode lands 201 to 203 and the respective spiral contactors 251 to 253 are varied, thereby implementing the hot swap mechanism of the electronic part 200 with respect to the circuit substrate 250. Moreover, similarly to the first embodiment, since the electrical connection is achieved by bringing each of the electrode lands 201 to 203 and each of the spiral contactors 251 to 253 into contact, the attaching/detaching mechanism of the electronic part 200 with respect to the circuit substrate 250 can be achieved. Therefore, for example, at the time of maintenance or replacement of parts, attachment and detachment of the electronic part 200 is possible while achieving the hot swap mechanism. Furthermore, since this electrical connection of the electronic part and the circuit substrate is applicable to BGA and LGA, high density mounting of the electronic part 200 becomes possible. The electrode lands 201 to 203 and the spiral contactors 251 to 253 can be formed such that the sizes thereof along the main surface 216 and the main surface 256 are different from each other as described in the first embodiment.

In the second embodiment, a case where disk-shaped connecting terminals (electrode lands) as the electrical connecting terminal of an electronic part and convex spiral contactors as the electrical contactors of a circuit substrate are respectively used has been explained.

On the other hand, in electrical connection of an electronic part and a circuit substrate according to a third embodiment of the present invention, disk-shaped (cylindrical) connecting terminals (electrodes) having different heights are used as the electrical connecting terminals of the electronic part, and convex spiral contactors having different heights are used as the electrical contactors of the circuit substrate. In the third embodiment, the same reference characters are used for the parts that have been explained, and duplicate explanation is omitted.

Figure 9:
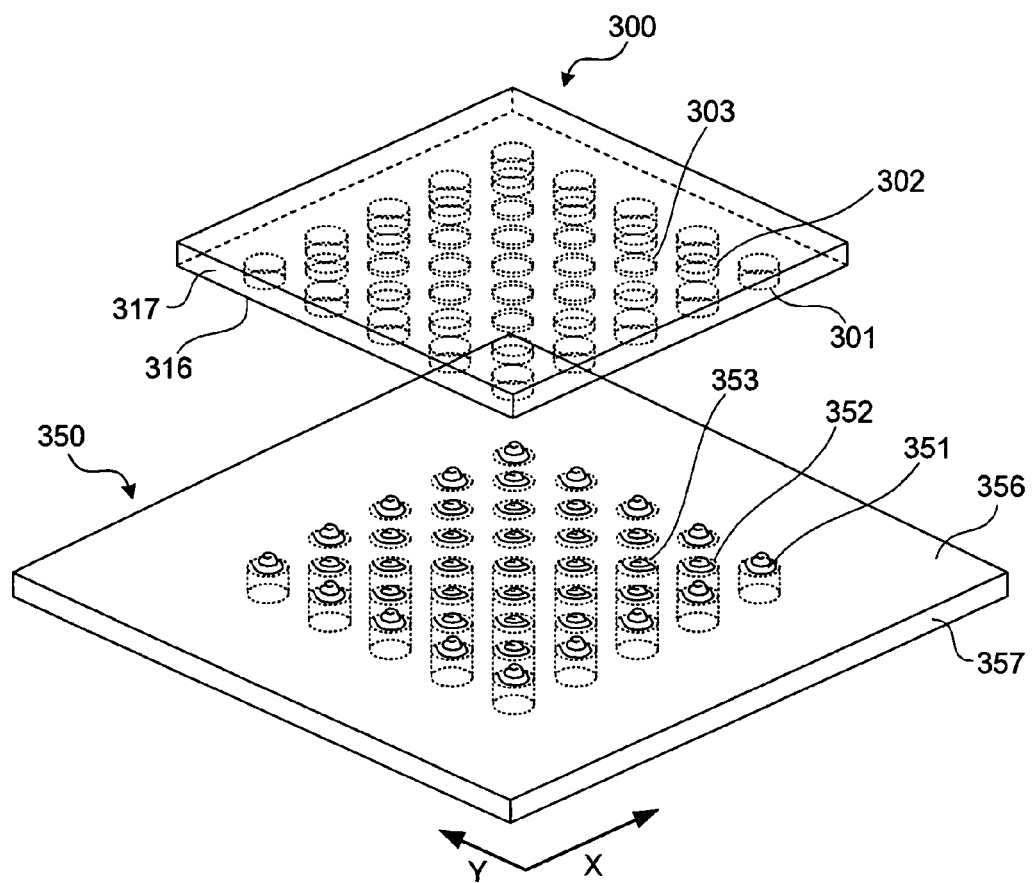
FIG. 9 is a perspective view of an electronic part and a circuit substrate according to a third embodiment of the present invention.

FIG. 9 is a perspective view of the electronic part and the circuit substrate according to the third embodiment. As shown in FIG. 9, in an electronic part 300, such as CPS, disk-shaped electrodes 301 to 303 as a plurality of electrical connecting terminals are formed on a main surface 316 of a connecting substrate 317, and arranged two-dimensionally in the X direction and the Y direction. Moreover, in a circuit substrate 350 on which the electrical part 300 is mounted, convex spiral contactors 351 to 353 as a plurality of electrical contactors are formed at positions respectively corresponding to positions of the electrodes 301 to 303, and arranged two-dimensionally in the X direction and the Y direction.

The electrodes 301 to 303 are formed such that the size (diameter) thereof along the main surface 316 is identical, and the height thereof in the direction of contact with the circuit substrate 350 gradually increases toward the edge of the main surface 316. Furthermore, the spiral contactors 351 to 353 are formed at positions corresponding to positions of the electrodes 301 to 303 on the main surface 356, such that the size (diameter) thereof along a main surface 356 is identical, and the height thereof in the direction of contact with the electrode part 300 gradually increases toward the edge of the main surface 356.

Figure 10A:
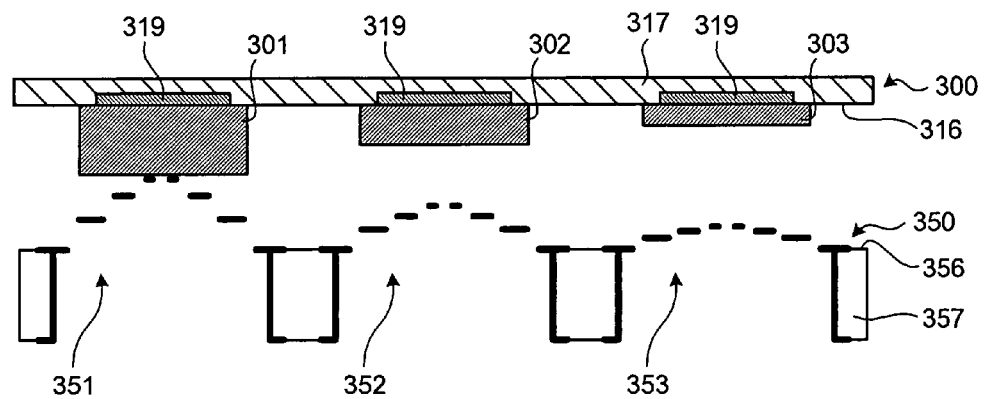
FIGS. 10A to 10C are diagrams showing a process of connecting the electronic part and the circuit substrate according to the third embodiment.
Figure 10B:
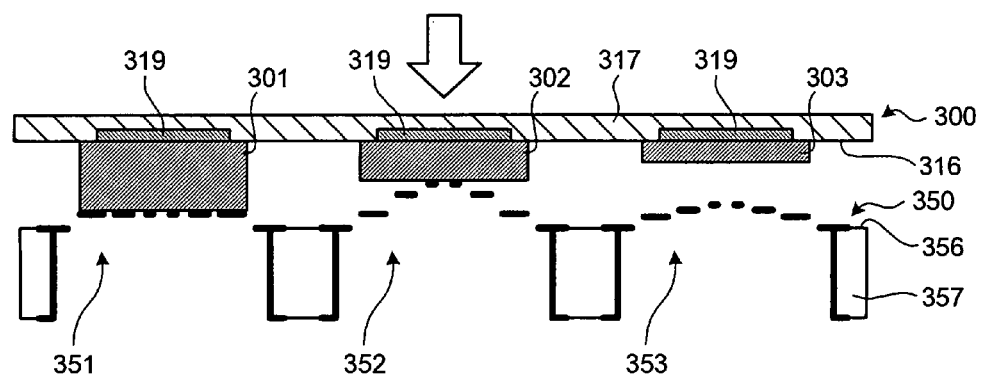
Figure 10C:
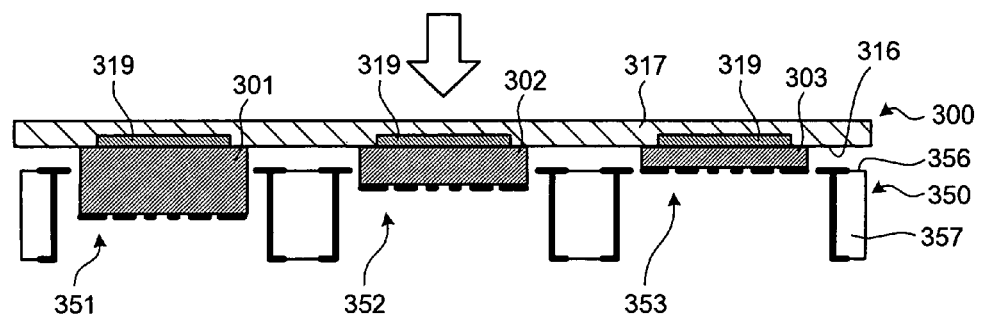
Figure 11:
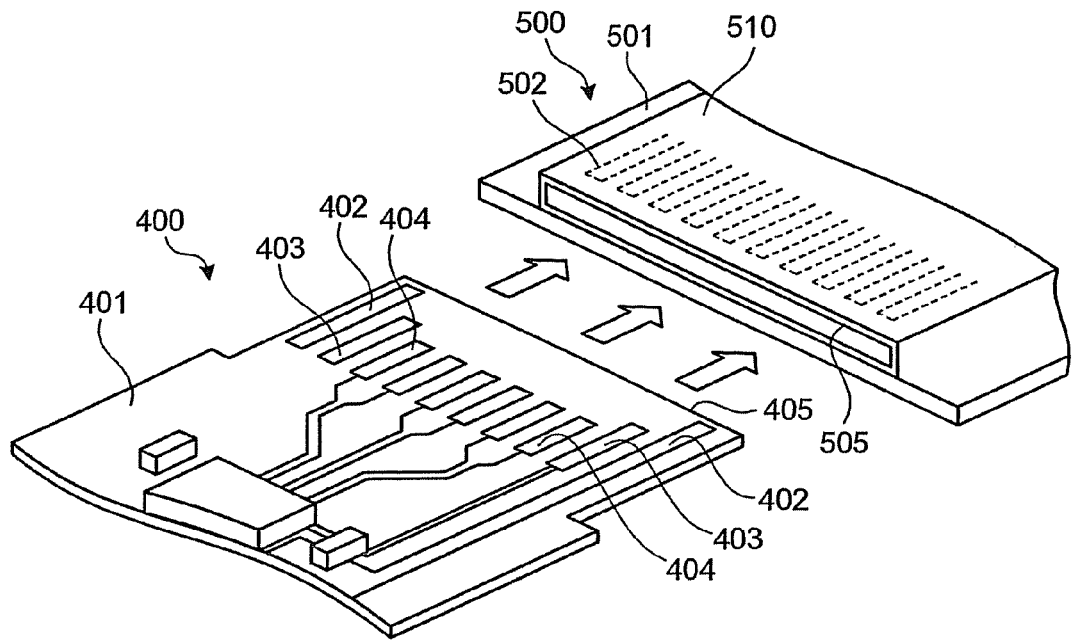
FIG. 11 is a perspective view of an electronic part and a circuit substrate that implement a conventional hot swap mechanism.
Figure 12:
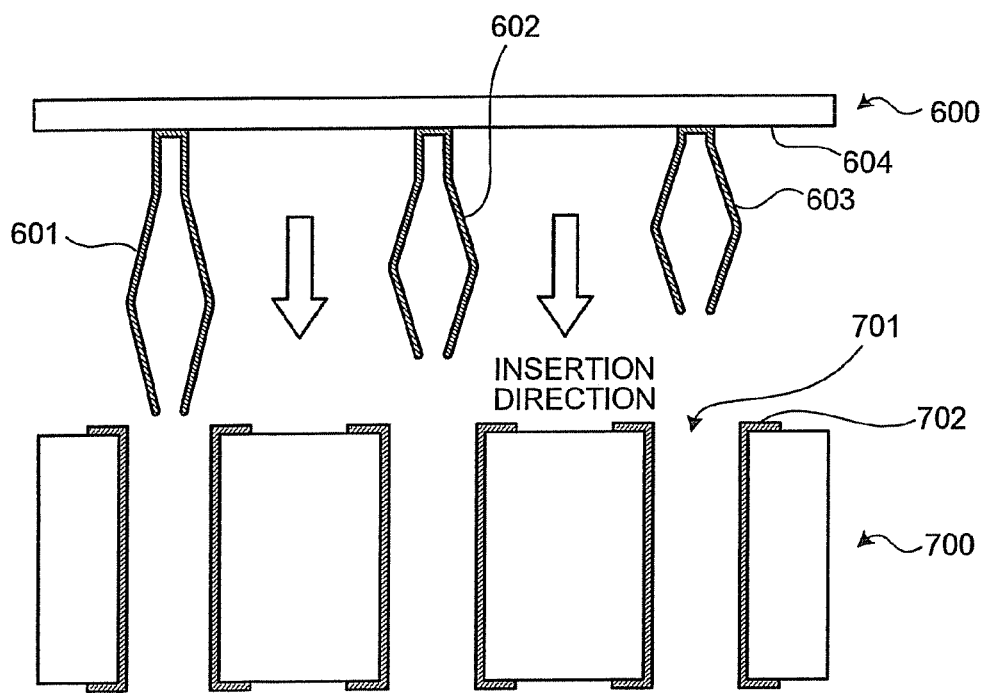
FIG. 12 is a partial cross-section of an electronic part and a circuit substrate that implement the conventional hot swap mechanism.
Figure 13A:
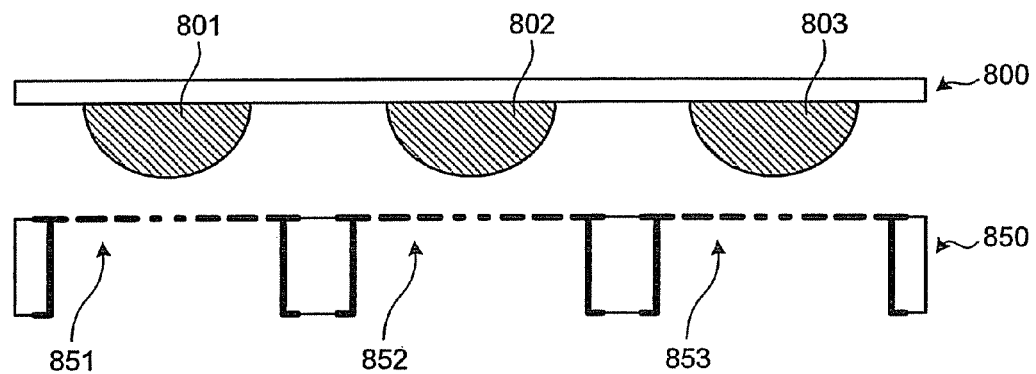
FIGS. 13A to 13C are action transition diagrams for explaining conventional electrical connection between an electronic part and a circuit substrate using spiral contactors.
Figure 13B:
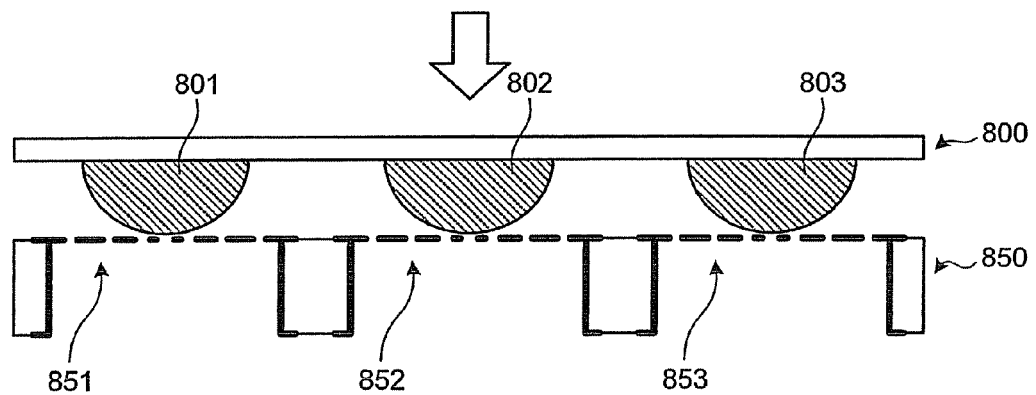
Figure 13C:
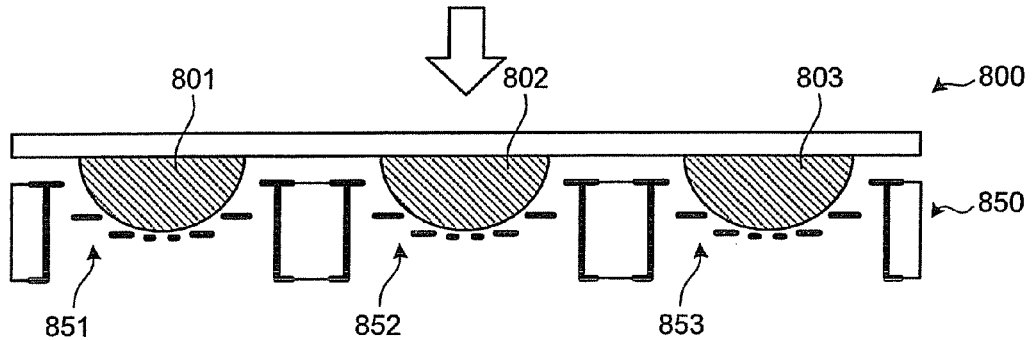
Figure 14A:
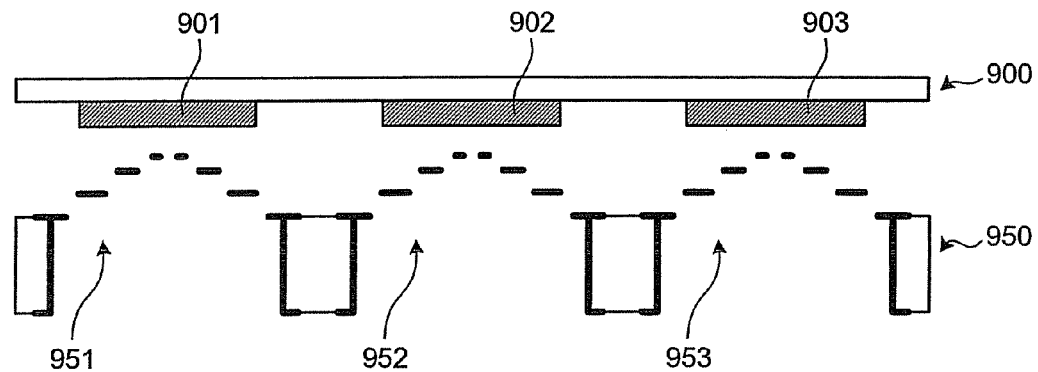
FIGS. 14A to 14C are action transition diagrams for explaining conventional electrical connection between an electronic part and a circuit substrate using spiral contactors.
Figure 14B:
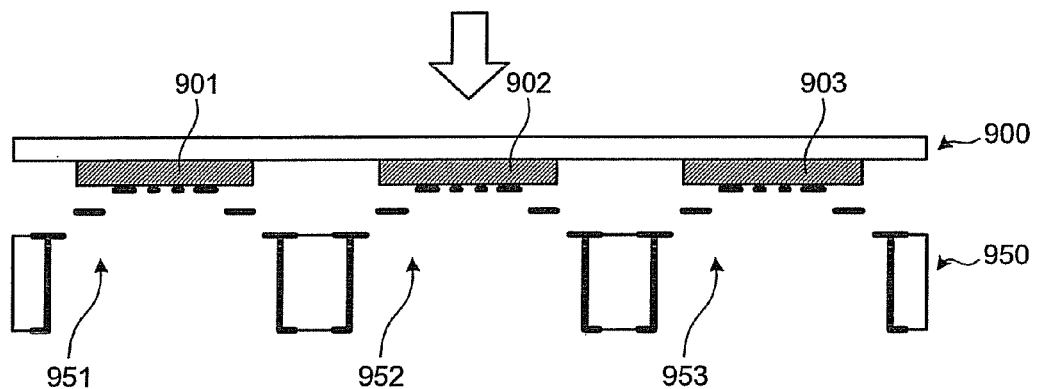
Figure 14C:
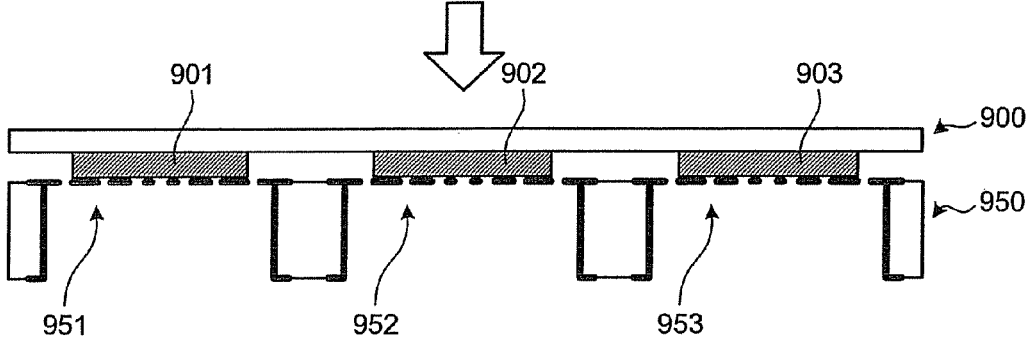

When the electronic part 300 in which the electrodes 301 to 303 are formed is mounted on the circuit substrate 350 in which the spiral contactors 351 to 353 are thus formed, each of the electrodes 301 to 303 and each of the spiral contactors 351 to 353 come into contact as follows to establish electrical connection. FIGS. 10A to 10C are diagrams showing a process of connecting the electronic part 300 and the circuit substrate 350. First, as shown in FIG. 10A, when the electronic part 300 in which the electrodes 301 to 303 are formed on a conductor pattern 319 of the connecting substrate 317 is brought close to the circuit substrate 350, the electrode 301 having the largest height and the spiral contactor 351 having the largest height come into contact first.

Then, as shown in FIG. 10B, when the electronic part 300 is brought closer to the circuit substrate 350 in the direction of electrical connection (direction indicated by an outlined arrow in FIG. 10B), the electrode 302 having the second largest height and the spiral contactor 352 having the second largest height come into contact. Finally, as shown in FIG. 10C, when the electronic part 300 is brought even closer in the direction of electrical connection (direction indicated by an outlined arrow in FIG. 10C), the electrode 303 having the smallest height and the spiral contactor 353 having the smallest height come into contact. Thus, the electronic part 300 and the circuit substrate 350 are electrically connected completely.

With such electrical connection, when the electronic part 300 is connected to the circuit substrate 350, it is possible to bring the electrode 301 and the spiral contactor 351 into contact to be alive first, the electrode 302 and the spiral contactor 352 into contact to be alive next, and the electrode 303 and the spiral contactor 353 into contact to be alive finally. Moreover, when the electronic part 300 is separated from the circuit substrate 350, it is possible to disconnect the electrode 303 and the spiral contactor 353 first, the electrode 302 and the spiral contactor 352 next, and the electrode 301 and the spiral contactor 351 finally, in reverse order to the order in the case of connection.

With this arrangement, the hot swap mechanism, in which an arbitrary circuit in the electronic part 200 is energized first and other circuits are energized later, can be implemented. As described above, according to the electrical connection of the electronic part and the circuit substrate according to the third embodiment, the height of the electrodes 301 to 303 and the height of the spiral contactors 351 to 353 of the circuit substrate 350 are varied so as to increase toward the edge of the main surface 316 and the edge of the main surface 356 in the direction of contact with each other.

Therefore, the contact/separation timing of the respective electrodes 301 to 303 and the respective spiral contactors 351 to 353 are varied further certainly, thereby implementing the hot swap mechanism. Moreover, similarly to the first embodiment and the second embodiment, since the electrical connection is achieved by bringing each of the electrodes 301 to 303 and each of the spiral contactors 351 to 353 into contact, the attaching/detaching mechanism of the electronic part 300 with respect to the circuit substrate 350 can also be achieved. Therefore, for example, at the time of maintenance or replacement of parts, attachment and detachment of the electronic part 300 is possible while achieving the hot swap mechanism. Furthermore, since this electrical connection of the electronic part and the circuit substrate is applicable to BGA and LGA, high density mounting of the electronic part 300 becomes possible. The electrodes 301 to 303 and the spiral contactors 351 to 353 can be formed such that the sizes thereof along the main surface 316 and the main surface 356 are different from each other as described in the first embodiment.

Moreover, although illustration and explanation are omitted, besides usage of the deformable spiral contactors described above as the electrical contactors of the circuit substrate, the electrical connection of the electronic part and the circuit substrate according to the present invention can be implemented, for example, by forming regular electrode lands in the circuit substrate, and using deformable conductive rubber or anisotropically conductive rubber having different sizes as the electrodes of the electronic part. With such a configuration also, the contact/separation timing of the electronic part and the circuit substrate can be varied, thereby implementing the hot swap mechanism at the same time with implementation of the attaching/detaching mechanism.

As described above, according to the electrical connection of the electronic part and the circuit substrate of the first to the third embodiments of the present invention, an attaching/detaching mechanism and a hot swap mechanism of an electronic part in high density mounting can be implemented at the same time.

The present invention is not limited to the first to the third embodiments described above, and various modifications can be applied within a scope not departing from the points of the present invention. For example, instead of the electronic part 100 to be mounted on the circuit substrate 150, a connector having electrical connecting terminals can be used to achieve the electrical connection in which the contact/separation timing is varied. Moreover, while in the first embodiment, for example, a case where the spiral contactors 151 to 153 are flat in the initial state as shown in FIG. 4A has been explained, the spiral contactors 151 to 153 are not necessarily required to be identical in height relative to the main surface 116 of the circuit substrate 150, as long as it is within a predetermined range. In other words, when the height of the solder bump 101 relative to the main surface 116 and the height of the solder bump 102 relative to the main surface 116 are different by ΔD, even if the height of the spiral contactor 152 is larger than the height of the spiral contactor 151, as long as the difference is smaller than ΔD, contact of the solder bump 101 and the spiral contactor 151 occurs first, as described above, at the time of connection, and the contact between the solder bump 101 and the spiral contactor 151 is released last at the time of separation.

According to the embodiments of the present invention described above, an attaching/detaching mechanism and a hot swap mechanism of an electronic part and a circuit substrate can be implemented at the same time. Moreover, order of electrical connection with a circuit substrate can be controlled even for electrical connecting terminals of an electronic part of surface-mounting type.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An electronic part that is mounted on a circuit substrate having a plurality of elastic electrical contactors, and that includes a plurality of electrical connecting terminals enabling electrical connection with the circuit substrate by contacting the electrical contactors, wherein the electrical connecting terminals are two-dimensionally arranged to be different in height from each other, the height relative to a surface on which the electrical connecting terminals are arranged, and the electrical contactors are spherical terminals.

2. An electronic part that is mounted on a circuit substrate having a plurality of elastic electrical contactors, and that includes a plurality of electrical connecting terminals enabling electrical connection with the circuit substrate by contacting the electrical contactors, wherein the electrical connecting terminals are two-dimensionally arranged to be different in height from each other, the height relative to a surface on which the electrical connecting terminals are arranged, and the electrical connecting terminals are spherical connecting terminals formed on electrodes that have different diameters and are formed in the electronic part.

* * * * *